US012068342B2

(12) United States Patent
Wakashima

(10) Patent No.: US 12,068,342 B2
(45) Date of Patent: Aug. 20, 2024

(54) PHOTOELECTRIC CONVERSION DEVICE, IMAGING SYSTEM, AND MOVABLE BODY

(71) Applicant: CANON KABUSHIKI KAISHA, Tokyo (JP)

(72) Inventor: Shunichi Wakashima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 147 days.

(21) Appl. No.: 17/103,160

(22) Filed: Nov. 24, 2020

(65) Prior Publication Data
US 2021/0159258 A1    May 27, 2021

(30) Foreign Application Priority Data
Nov. 27, 2019 (JP) ................... 2019-214776

(51) Int. Cl.
| | | |
|---|---|---|
| H01L 27/146 | (2006.01) | |
| H01L 31/02 | (2006.01) | |
| H01L 31/101 | (2006.01) | |
| B60R 11/04 | (2006.01) | |

(52) U.S. Cl.
CPC .. *H01L 27/14612* (2013.01); *H01L 31/02019* (2013.01); *H01L 31/101* (2013.01); *B60R 11/04* (2013.01)

(58) Field of Classification Search
CPC ......... H01L 27/14612; H01L 31/02019; H01L 31/101; H01L 27/14609; B60R 11/04
See application file for complete search history.

(56) References Cited

U.S. PATENT DOCUMENTS

| | | | | |
|---|---|---|---|---|
| 6,657,665 | B1 * | 12/2003 | Guidash | H01L 27/14603 348/E3.018 |
| 7,964,929 | B2 * | 6/2011 | Fan | H01L 27/14609 257/443 |
| 2007/0158713 | A1 * | 7/2007 | Ohkawa | H01L 27/14689 348/E3.018 |
| 2010/0025569 | A1 * | 2/2010 | Matsumoto | H01L 27/14689 257/E31.073 |
| 2011/0068381 | A1 * | 3/2011 | Barbier | H01L 27/14609 257/292 |
| 2011/0134264 | A1 | 6/2011 | Nishihara | |

(Continued)

FOREIGN PATENT DOCUMENTS

| | | | |
|---|---|---|---|
| JP | 2001160619 A | * | 6/2001 |
| JP | 2001160619 A | | 6/2001 |

(Continued)

*Primary Examiner* — Bitew A Dinke
(74) *Attorney, Agent, or Firm* — Canon U.S.A., Inc., IP Division

(57) ABSTRACT

A photoelectric conversion device includes a semiconductor substrate, a photoelectric conversion unit, an amplification transistor, and an insulating isolation portion. The photoelectric conversion unit is disposed inside the semiconductor substrate. The amplification transistor is configured to output a signal from the photoelectric conversion unit. The insulating isolation portion, disposed between the photoelectric conversion unit and the amplification transistor to surround the amplification transistor in a plan view, is configured to penetrate through the semiconductor substrate. A first well in which the amplification transistor is disposed is connected to a source or a drain of the amplification transistor.

15 Claims, 16 Drawing Sheets

(56) References Cited

U.S. PATENT DOCUMENTS

| | | | |
|---|---|---|---|
| 2011/0180689 A1* | 7/2011 | Roy | H01L 27/14609 |
| | | | 438/73 |
| 2015/0115338 A1 | 4/2015 | Taruki | |
| 2016/0043132 A1* | 2/2016 | Ihara | H01L 27/14643 |
| | | | 257/291 |
| 2016/0233257 A1* | 8/2016 | Kao | H01L 21/76237 |
| 2017/0200759 A1* | 7/2017 | Ihara | H01L 27/1463 |
| 2017/0207259 A1* | 7/2017 | Yun | H01L 27/14621 |
| 2017/0213862 A1* | 7/2017 | Kamino | H01L 27/14614 |
| 2017/0287955 A1* | 10/2017 | Ukigaya | H01L 27/1464 |
| 2018/0190692 A1* | 7/2018 | Choi | H01L 27/1463 |
| 2018/0190709 A1* | 7/2018 | Lee | H01L 31/02019 |
| 2018/0213169 A1* | 7/2018 | Onuki | H04N 5/37452 |
| 2018/0226439 A1* | 8/2018 | Oda | H04N 5/374 |
| 2018/0270405 A1* | 9/2018 | Ota | H01L 31/02027 |
| 2018/0350856 A1* | 12/2018 | Masagaki | H01L 27/14641 |
| 2019/0110014 A1* | 4/2019 | Ishiwata | H04N 25/677 |
| 2020/0021759 A1* | 1/2020 | Tashiro | H04N 25/778 |
| 2020/0076999 A1* | 3/2020 | Akiyama | H01L 27/14647 |
| 2020/0098798 A1* | 3/2020 | Takahashi | H01L 27/14603 |
| 2020/0135786 A1* | 4/2020 | Onuki | H01L 27/14636 |
| 2020/0219912 A1* | 7/2020 | Ro | H01L 27/14612 |
| 2020/0227450 A1* | 7/2020 | Ukigaya | H01L 27/14621 |
| 2020/0279876 A1* | 9/2020 | Lee | H01L 27/14645 |
| 2020/0344433 A1* | 10/2020 | Fujita | H04N 5/378 |
| 2020/0412990 A1* | 12/2020 | Akabori | H04N 25/63 |
| 2021/0074747 A1* | 3/2021 | Takahashi | H01L 27/14689 |

FOREIGN PATENT DOCUMENTS

| | | |
|---|---|---|
| JP | 2003087663 A | 3/2003 |
| JP | 2011119441 A | 6/2011 |
| JP | 2016005068 A | 1/2016 |
| JP | 2017183661 A | 10/2017 |
| JP | 2019165136 A | 9/2019 |
| WO | WO-2019111373 A1 * | 6/2019 |

* cited by examiner

PHOTOELECTRIC CONVERSION DEVICE, IMAGING SYSTEM, AND MOVABLE BODY

BACKGROUND

Technical Field

One disclosed aspect of the embodiments relates to a photoelectric conversion device with reduced deterioration in signal linearity, an imaging system, and a movable body.

Description of the Related Art

A photoelectric conversion device that includes pixels each including an amplification transistor (hereinafter, AMP) is well-known. To prevent deterioration in linearity of a signal caused by a substrate bias effect of the amplification transistor AMP, it is necessary to connect a well (e.g., a first well) including the amplification transistor AMP and a source of the amplification transistor AMP. In addition, it is necessary to isolate the first well from a photoelectric conversion unit. Japanese Patent Application Laid-Open No. 2001-160619 discusses that a trench and an N-type isolation layer are used as a portion isolating a P-type first well in which the amplification transistor AMP is disposed and a P-type second well in which the photoelectric conversion unit is disposed. More specifically, the trench disposed between the first well and the second well and the N-type isolation layer disposed below the first well are discussed, and the first well and the second well are isolated by the trench and the N-type isolation layer.

To isolate the first well and the second well and to prevent deterioration in linearity of the signal from the amplification transistor AMP in the technology discussed in Japanese Patent Application Laid-Open No. 2001-160619, it is necessary to apply a predetermined voltage to the N-type isolation layer. In the technology discussed in Japanese Patent Application Laid-Open No. 2001-160619, however, a voltage cannot be applied to the isolation layer so that isolation of the first well and the second well may become insufficient. To apply the voltage to the isolation layer, it is necessary to dispose an N-type semiconductor region up to a surface provided with the trench. If the N-type semiconductor layer is disposed, however, an area of the portion isolating the first well and the second well is increased with respect to the pixel, which may make it difficult to secure an area of the photoelectric conversion unit.

SUMMARY

One aspect of the embodiments is directed to prevention of deterioration in linearity of a signal caused by a substrate bias effect of an amplification transistor while isolating a well in which the amplification transistor is disposed from a photoelectric conversion unit, by a small area.

According to an aspect of the present disclosure, a photoelectric conversion device includes a semiconductor substrate, a photoelectric conversion unit, an amplification transistor, and an insulating isolation portion. The photoelectric conversion unit is disposed inside the semiconductor substrate. The amplification transistor is configured to output a signal from the photoelectric conversion unit. The insulating isolation portion, disposed between the photoelectric conversion unit and the amplification transistor to surround the amplification transistor in a plan view, is configured to penetrate through the semiconductor substrate. A first well in which the amplification transistor is disposed is connected to a source or a drain of the amplification transistor.

Further features of the present disclosure will become apparent from the following description of exemplary embodiments with reference to the attached drawings.

DESCRIPTION OF THE EMBODIMENTS

Figure 1:
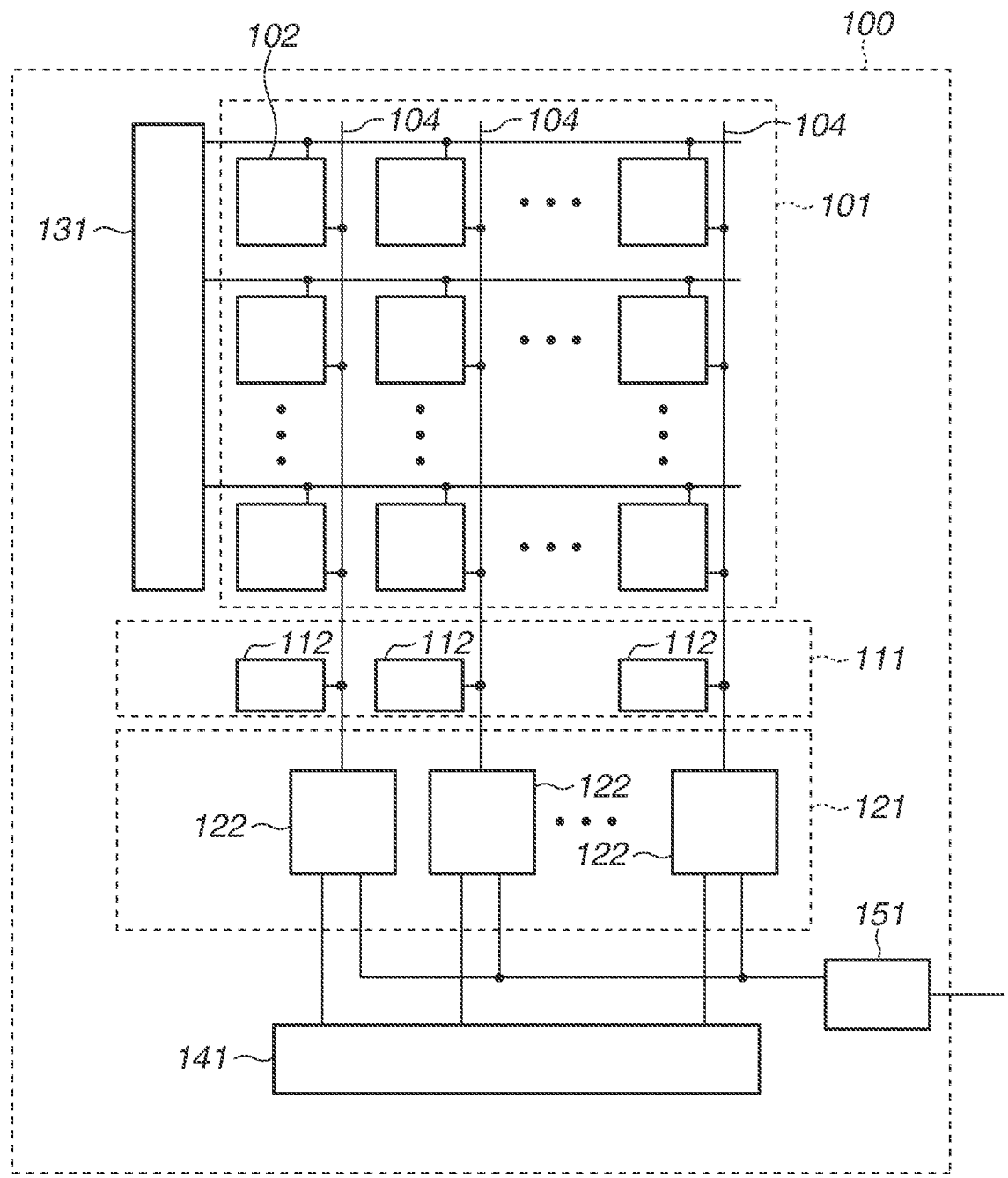
FIG. 1 is a block diagram illustrating a circuit configuration of a photoelectric conversion device according to a first exemplary embodiment.

Some exemplary embodiments of the present disclosure are described below with reference to drawings. The following exemplary embodiments each illustrate an example of the present disclosure, and numerical values, shapes, materials, components, arrangement and connection states of the components, and the like do not limit the present disclosure. Further, in the drawings described below, components having the same functions are denoted by the same reference numerals, and descriptions of the components are omitted or simplified in some cases.

The present disclosure is not limited to the following exemplary embodiments, and can be variously modified. For example, an example in which a part of a configuration of any of the exemplary embodiments is added to the other exemplary embodiment or is replaced with a part of the configuration of the other exemplary embodiment is also included in the exemplary embodiments of the present disclosure. In other words, the present disclosure can be implemented in various modes without departing from the technical ideas or the main features of the present disclosure.

In the following description, a first conductivity type semiconductor region that uses carriers same as signal carriers as majority carriers is an N-type semiconductor region, and a second conductivity type semiconductor region is a P-type semiconductor region. In other words, the signal carriers are electrons. The conductivity types can be all inverted from each other. In other words, the signal carriers can be holes, the first conductivity type semiconductor region can be the P-type semiconductor region, and the second conductivity type semiconductor region can be the N-type semiconductor region.

A photoelectric conversion device according to a first exemplary embodiment of the present disclosure is described with reference to FIG. 1 to FIG. 5.

FIG. 1 is a block diagram schematically illustrating a configuration example of the photoelectric conversion device. A photoelectric conversion device 100 includes a pixel array unit 101, a constant current source unit 111, an analog-to-digital (AD) conversion unit 121, a vertical scan circuit 131, a horizontal scan circuit 141, and an output unit 151.

The pixel array unit 101 includes a plurality of pixels 102 arranged in a two-dimensional array shape. Signal voltages of pixels positioned in a predetermined pixel row selected by the vertical scan circuit 131 are read out to output lines 104. In FIG. 1, one output line 104 is provided for each pixel column. Alternatively, a plurality of output lines can be provided for each pixel column, or one output line can be provided for each plurality of pixel columns.

The constant current source unit 111 includes constant current source circuits 112 provided for the respective output lines 104. The constant current source circuits 112 are electrically connected to amplification transistors included in the pixels 102.

The AD conversion unit 121 includes a plurality of AD conversion circuits 122. The plurality of AD conversion circuits 112 is disposed for the respective output lines 104. The AD conversion unit 121 converts the signal voltages output to the output lines 104 into digital signals, and holds the digital signals. Thereafter, the horizontal scan circuit 141 sequentially outputs the digital signals to an outside of the photoelectric conversion device 100 through the output unit 151. The operation is repeatedly performed while the vertical scan circuit 131 scans a selected row. As a result, two-dimensional image data is generated.

Figure 2:
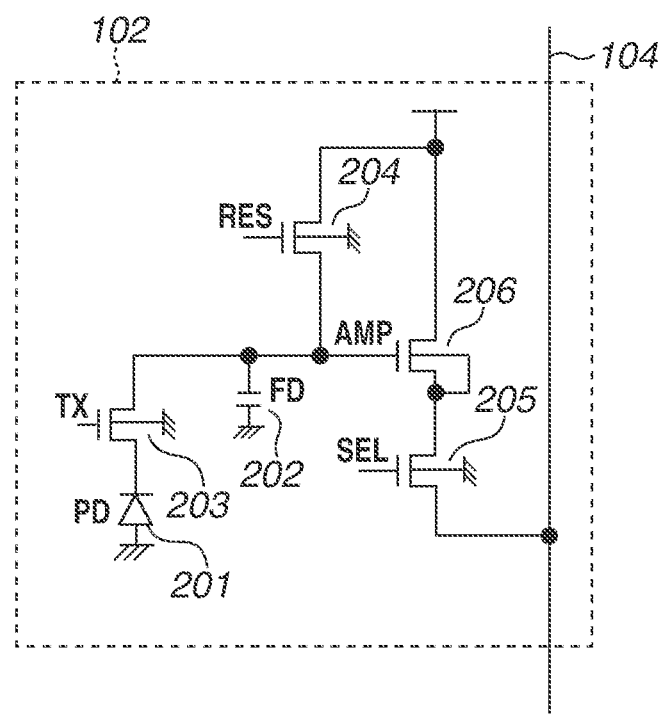
FIG. 2 is an equivalent circuit diagram of a pixel according to the first exemplary embodiment.

FIG. 2 is an equivalent circuit diagram of one pixel 102 according to the present exemplary embodiment.

Each of the pixels 102 includes a photodiode (PD) 201 that is included in a photoelectric conversion unit, a floating diffusion (FD) portion 202, a transfer transistor (TX) 203, a reset transistor (RES) 204, a selection transistor (SEL) 205, and an amplification transistor (AMP) 206. A well $W_{AMP}$ in which the amplification transistor AMP 206 is disposed is electrically isolated from a well in which the other transistors are disposed, and is electrically connected to a source of the amplification transistor AMP 206. In the following, a case where a source follower transistor is used as the amplification transistor AMP 206 is described; however, the configuration of the amplification transistor AMP 206 is not limited thereto. For example, the amplification transistor AMP 206 can be a source-grounded amplification transistor. In each of the pixels 102, the selection transistor SEL 205 and the reset transistor RES 204 are not essential. Each of the pixels 102 can include a plurality of PDs 201, and the plurality of PDs 201 can share the amplification transistor AMP. Further, each of the pixels 102 can include a plurality of PDs 201 and a plurality of amplification transistors AMP 206.

Figure 3:
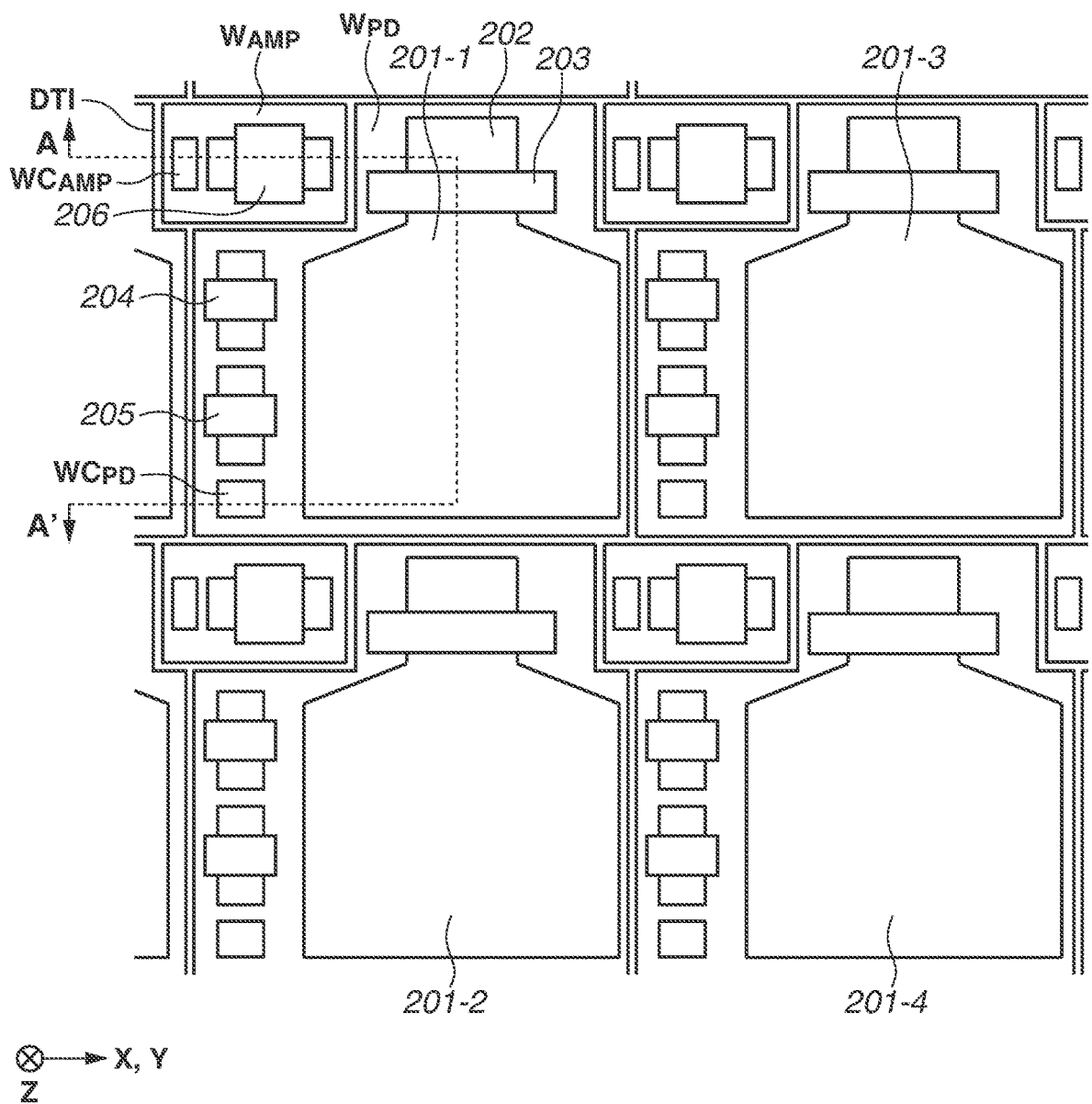
FIG. 3 is a diagram illustrating a layout of pixels according to the first exemplary embodiment.

FIG. 3 illustrates a layout of the pixels according to the present exemplary embodiment. FIG. 3 illustrates the layout including the pixels each corresponding to the equivalent circuit diagram of FIG. 2, and illustrates four pixels arranged in two rows×two columns in a plan view. A lateral direction in FIG. 3 corresponds to an X or Y direction, and a direction toward a back side on a paper surface corresponds to a Z direction. In the present specification, "plan view" indicates that a surface parallel to a surface of a semiconductor substrate provided with a gate of a transistor is viewed from a direction perpendicular to the parallel surface. In other words, "plan view" indicates that the surface parallel to a first surface of the semiconductor substrate is viewed from the Z direction or −Z direction in FIG. 3. In FIG. 3, a pixel at an upper left on the paper surface is referred to as a pixel 1, a pixel at a lower left is referred to as a pixel 2, a pixel at an upper right is referred to as a pixel 3, and a pixel at a lower right is referred to as a pixel 4. In the present specification, the PD 201 of a pixel m is denoted by 201-$m$, for example, the PD 201 of the pixel 1 is denoted by 201-1, and the PD 201 of the pixel 2 is denoted by 201-2. The other elements are similarly denoted. Further, in a case where the configurations of the elements are the same among the pixels, description is given while omitting the pixel number m. For example, in a case where the PDs 201 of the respective pixels have the same configuration, the PD is denoted by 201 by omitting the pixel number m of the PD 201-$m$ and is described.

Each of the pixels is divided into at least two regions by an insulating isolation portion Deep Trench Isolation (DTI) in a plan view. The amplification transistor AMP 206 is disposed in one of the regions, and the PD 201 is disposed in the other region. In a plan view, the insulating isolation portion DTI is disposed between the amplification transistor AMP 206 and the PD 201. The insulating isolation portion DTI is disposed so as to surround the amplification transistor AMP 206. The insulating isolation portion DTI has a function to isolate the well $W_{AMP}$ including a region serving as a channel of the amplification transistor AMP 206 and a well $W_{PD}$ in which the PD 201 is disposed. In FIG. 3, the insulating isolation portion DTI also isolates the wells $W_{PD}$ in which the PD 201 is disposed between the adjacent pixels; however, the wells $W_{PD}$ between the adjacent pixels may not be isolated from each other.

The well $W_{AMP}$ is electrically connected to the source of the amplification transistor AMP 206 through an AMP well contact $WC_{AMP}$ disposed in the well $W_{AMP}$. The well $W_{PD}$ is electrically connected to a ground voltage through a PD well contact $WC_{PD}$ disposed in the well $W_{PD}$. The transfer transistor TX 203, the reset transistor RES 204, and the selection transistor SEL 205 are disposed in the well $W_{PD}$. In other words, the insulating isolation portion DTI is disposed between the amplification transistor AMP 206 and both of the reset transistor RES 204 and the selection transistor SEL 205.

Figure 4:
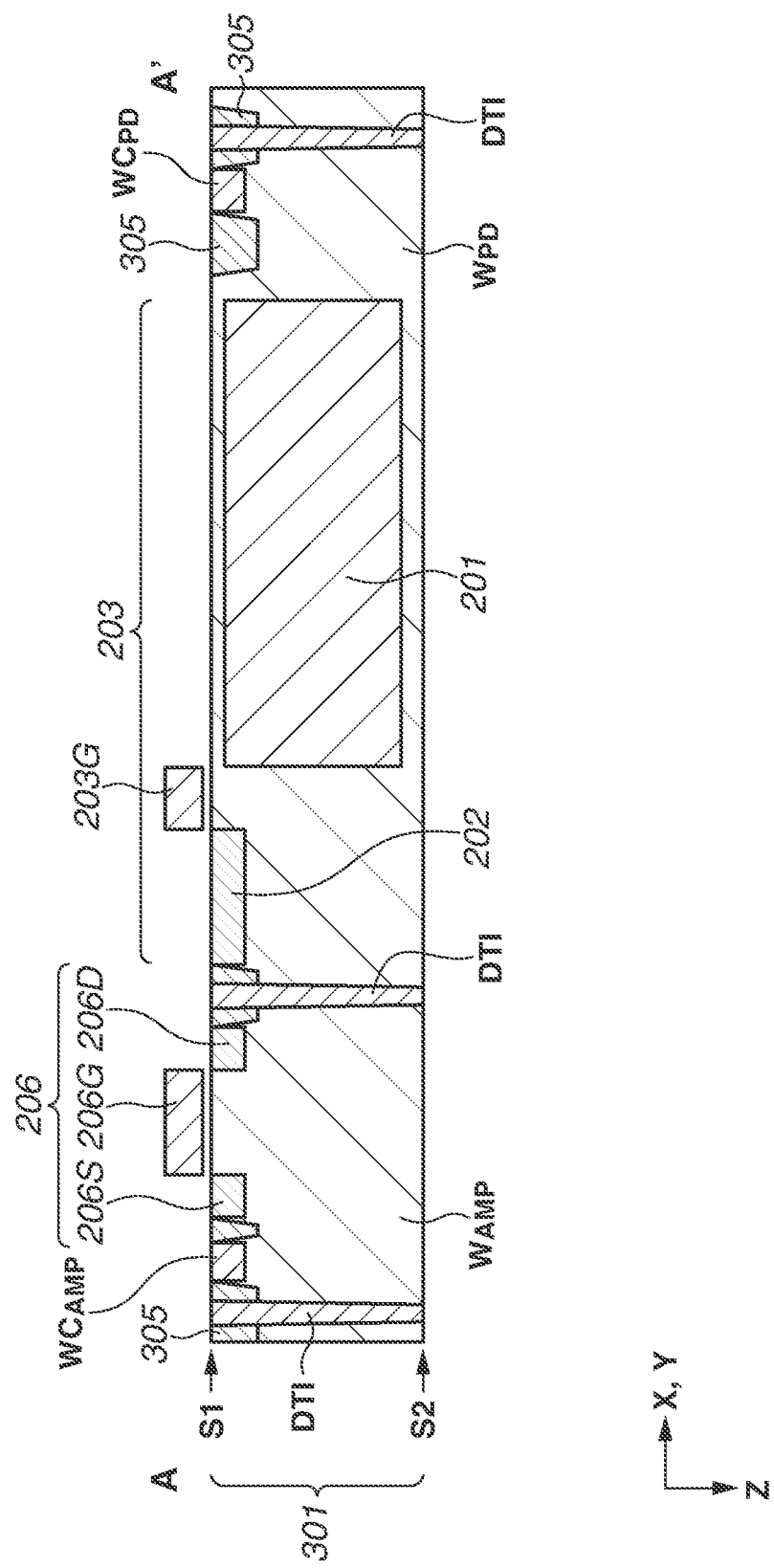
FIG. 4 is a schematic cross-sectional view of the pixel according to the first exemplary embodiment.

FIG. 4 is a schematic cross-sectional view taken along a line A-A' in FIG. 3. In a semiconductor substrate 301, a surface provided with an electrode 206G serving as a gate of the amplification transistor AMP 206 is referred to as a first surface S1, and a surface opposite to the first surface S1 is referred to as a second surface S2. A direction directed from the first surface S1 toward the second surface S2 is the Z direction. In FIG. 4, light enters the second surface S2. The second surface S2 is referred to as a rear surface, and the first surface S1 is referred to as a front surface in some cases. As the semiconductor substrate, for example, a silicon substrate or a silicon-on-insulator (SOI) substrate is usable.

A source and a drain of a pixel transistor such as the FD 202, the transfer transistor TX 203, the reset transistor RES 204, and the amplification transistor AMP 206 are included in an N-type semiconductor region in which N-type impurities are diffused. The electrode 206G serving as the gate of the amplification transistor AMP 206 and an electrode 203G serving as a gate of the transfer transistor TX 203 are disposed on the first surface S1. The well contact $WC_{AMP}$ of the well $W_{AMP}$ and the well contact $WC_{PD}$ of the well $W_{PD}$ are disposed inside the semiconductor substrate 301, and each included in the P-type semiconductor region in which P-type impurities are diffused. The well contact $WC_{AMP}$ and the well contact $WC_{PD}$ configure a part of the first surface S1 of the semiconductor substrate 301. An element isolation portion 305 is disposed between the transistors. The element isolation portion 305 has a shallow trench isolation (STI) structure or a local oxidation of silicon (LOCOS) structure. As illustrated in FIG. 4, in the Z direction, the insulating isolation portion DTI penetrates through the semiconductor substrate 301. In other words, the insulating isolation portion DTI is disposed inside the semiconductor substrate 301 from the first surface tS1 to the second surface S2. The insulating portion DTI is the full depth DTI. Inside the semiconductor substrate 301, the well $W_{AMP}$ including the region serving as the channel of the amplification transistor AMP 206 and the well $W_{PD}$ including the PD 201 are electrically isolated by the insulating isolation portion DTI.

As illustrated in FIG. 4, the insulating isolation portion DTI can be varied in width. For example, the width of the insulating isolation portion DTI can be reduced in the Z direction. The width of the insulating isolation portion DTI in a virtual plane passing through the first surface S1 and the width of the insulating isolation portion DTI in a virtual plane passing through the second surface S2 can be wider than the width of the insulating isolation portion DTI at a middle point of a line connecting the first surface S1 and the second surface S2. In other words, the insulating isolation portion DTI can include a portion having a first width, a portion having a second width narrower than the first width, and a third portion having a width wider than the second width in order in the Z direction. In a case where a through hole is formed from both of the first surface S1 and the second surface S2, the width at the middle point and the width in each of the virtual planes may be different like the latter.

The width of the insulating isolation portion DTI in the X or Y direction is about 0.5 µm. The well $W_{AMP}$ and the well $W_{PD}$ can be electrically isolated by a PN junction; however, in this case, it is necessary for the portion isolating the well $W_{AMP}$ and the well $W_{PD}$ to have a width of about 4.0 µm. In the case where the well $W_{AMP}$ and the well $W_{PD}$ are isolated by the insulating isolation portion and PN junction isolation as discussed in Japanese Patent Application Laid-Open No. 2001-160619, the large width is necessary as in the PN isolation or the wells may not be electrically isolated.

According to the present exemplary embodiment, the well $W_{AMP}$ and the PD 201 are physically isolated by the insulating isolation portion DTI penetrating through the semiconductor substrate 301. In other words, the well $W_{AMP}$ and the well $W_{PD}$ are physically isolated by the insulating isolation portion DTI. Therefore, as compared with the technology discussed in Japanese Patent Application Laid-Open No. 2001-160619 and the case of using the PN junction isolation, it is possible to electrically isolate the well $W_{AMP}$ and the well $W_{PD}$ while reducing an area necessary for the portion isolating the well $W_{AMP}$ and the well $W_{PD}$.

Figure 5:
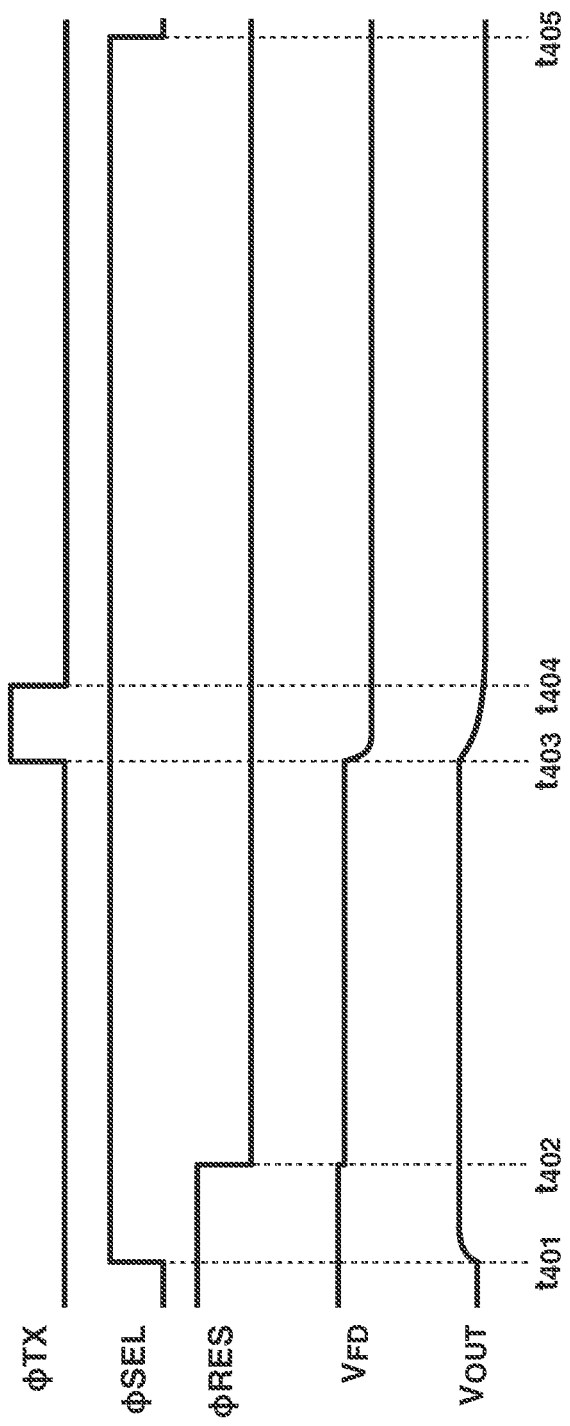
FIG. 5 is a driving timing chart of the pixel according to the first exemplary embodiment.

FIG. 5 is a driving timing chart illustrating signal readout of the pixel according to the present exemplary embodiment. In the present specification, timings are represented as time $t_{401}$ to time $t_{405}$ in FIG. 5. In the driving timing chart, φTX represents on/off of the transfer transistor TX 203, φRES represents on/off of the reset transistor RES 204, and φSEL represents on/off of the selection transistor SEL 205. In each of the transistors, an on time is represented by a high level, and an off time is represented by a low level. In addition, $V_{FD}$ represents change in the voltage of the FD 202, and $V_{OUT}$ represents change in the voltage of the output line 104. In the following, an operation of the signal readout of the pixel is described with reference to the timing chart in FIG. 5.

At time $t_{401}$, the selection transistor SEL 205 is turned on, the source of the amplification transistor AMP 206 and the output line 104 are connected, and the constant current source circuit 112 causes a constant current to flow through the amplification transistor AMP 206. A gate-source voltage ($V_{GS}$) of the amplification transistor AMP 206 becomes a voltage corresponding to the constant current determined by the constant current source circuit 112. The voltage $V_{OUT}$ connected to the source becomes a voltage corresponding to the voltage $V_{FD}$ connected to the gate.

At time $t_{402}$, the reset transistor RES 204 is turned off, and the FD 202 is put into a floating state. Thereafter, during a period from time $t_{402}$ to time $t_{403}$, the AD conversion circuit 122 converts the voltage $V_{OUT}$ into a digital signal. The signal obtained at this time is referred to as an N signal.

At time $t_{403}$, the transfer transistor TX 203 is turned on, and at time $t_{404}$, the transfer transistor TX 203 is turned off. During a period from time $t_{403}$ to time $t_{404}$, signal charges accumulated in the PD 201 are transferred to the FD 202. Thereafter, during a period from time $t_{404}$ to time $t_{405}$ when the selection transistor SEL 205 is turned off, the AD conversion circuit 122 converts the voltage $V_{OUT}$ into a digital signal. The signal obtained at this time is referred to as an N+S signal.

A signal corresponding to a charge amount of the signal charges generated in the PD 201 can be obtained by calculating a difference between the N signal and the N+S signal obtained in the above-described manner.

Figure 15A:
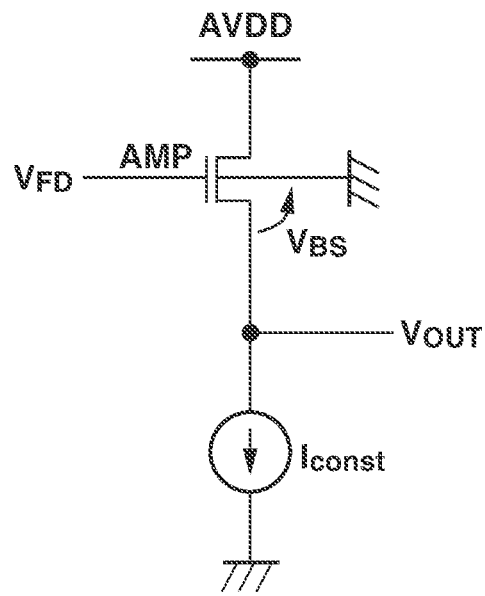
FIGS. 15A and 15B are respectively a circuit diagram illustrating a comparative example and a diagram illustrating a signal from a pixel.
Figure 15B:
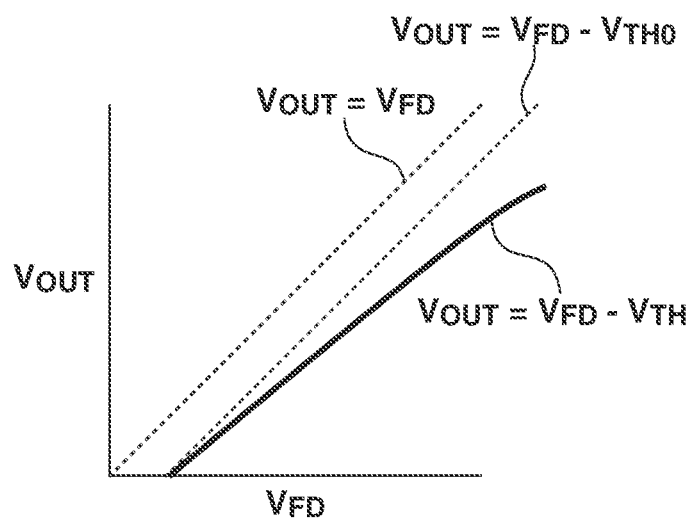
Figure 16A:
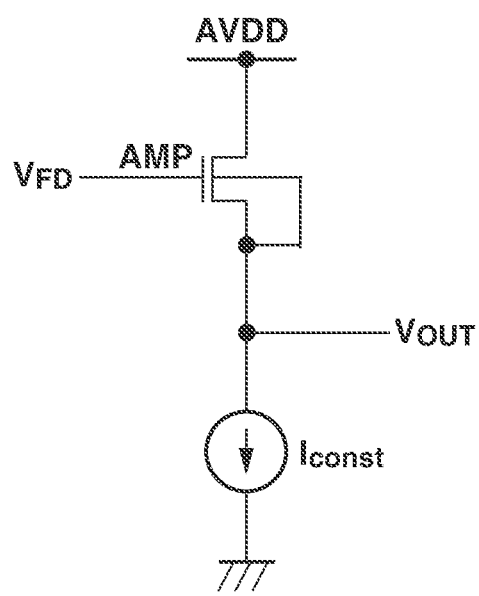
FIGS. 16A and 16B are respectively a circuit diagram according to the first exemplary embodiment and a diagram illustrating a signal from the pixel.
Figure 16B:
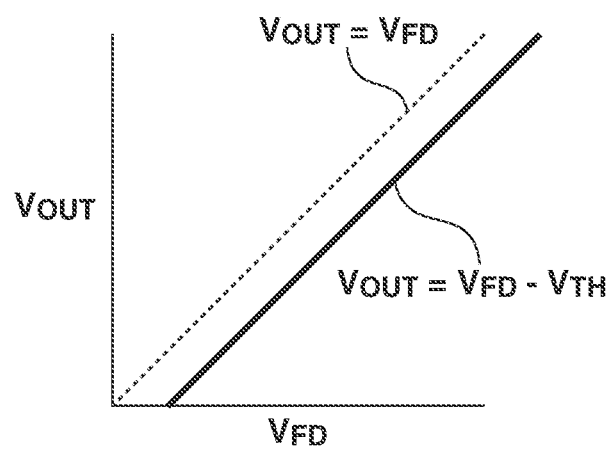

Influence of a well voltage of the amplification transistor AMP 206 on linearity of the signal is described with reference to FIG. 15A, FIG. 15B, FIG. 16A, and FIG. 16B. FIG. 15A and FIG. 15B are diagrams illustrating a comparative example, and FIG. 16A and FIG. 16B are diagrams illustrating the present exemplary embodiment. The gate-source voltage $V_{GS}$ of the amplification transistor AMP 206 at the AD conversion can be generally obtained from Equation (1) described below, $$I_{const} = \frac{1}{2} \cdot \frac{W}{L} \cdot \mu \cdot C_{OX}(V_{GS} - V_{TH})^2 \tag{1}$$

where $I_{const}$ is a constant current determined by the constant current source circuit 112, W is a gate width of the amplification transistor AMP 206, L is a gate length of the amplification transistor AMP 206, µ is mobility of channel electrons of the amplification transistor AMP 206, $C_{OX}$ is a capacity per unit area of the amplification transistor AMP 206, and $V_{TH}$ is a threshold voltage.

The threshold voltage $V_{TH}$ can be generally obtained from Equation (2) described below, $$V_{TH} = V_{TH0} + \gamma(\sqrt{-V_{BS} + 2\varphi_F} - \sqrt{2\varphi_F}) \tag{2}$$

where $V_{BS}$ is a back bias voltage (well-source voltage), $V_{TH0}$ is a threshold voltage when the back bias voltage $V_{BS}$ is 0 V, $2\phi F$ is a surface potential, and $\gamma$ is a substrate effect parameter.

As illustrated in FIG. 15A and FIG. 15B, in the comparative example, the well $W_{AMP}$ and the well $W_{PD}$ are not isolated, and the well $W_{AMP}$ is grounded. In the comparative example, since the back bias voltage $V_{BS}$ is changed, the threshold voltage $V_{TH}$ is nonlinearly changed, and the gate-source voltage $V_{GS}$ is not constant even when the constant current $I_{const}$ flows through the amplification transistor AMP 206. Therefore, the voltage change of the output line 104 to the voltage change of the FD 202 becomes nonlinear. As described above, in the case where the well $W_{AMP}$ and the well $W_{PD}$ are not isolated and the well $W_{AMP}$ is grounded, the back bias voltage $V_{BS}$ is changed by the output signal voltage, which deteriorates linearity of the signal.

As illustrated in FIG. 16A and FIG. 16B, in the present exemplary embodiment, the well $W_{AMP}$ is physically isolated from the well $W_{PD}$, and the source of the amplification transistor AMP 206 and the well $W_{PD}$ are electrically connected. Therefore, the back bias voltage $V_{BS}$ is fixed to 0 V. This makes it possible to make the threshold voltage $V_{TH}$ of the amplification transistor AMP 206 constant. Accordingly, the linearity of the signal does not become nonlinear.

As described above, in the present exemplary embodiment, it is possible to prevent deterioration in linearity of the signal caused by a substrate bias effect.

As described above, according to the present exemplary embodiment, it is possible to isolate the well $W_{AMP}$ and the well $W_{PD}$ with a small volume as compared with the PN junction isolation, and to prevent deterioration in linearity of the signal caused by the substrate bias effect.

A pixel according to a second exemplary embodiment of the present disclosure is described with reference to FIG. 6 and FIG. 7. The present exemplary embodiment is different from the first exemplary embodiment in that the pixel includes a plurality of PDs 201 and a plurality of transfer transistors TX 203, and the plurality of PDs 201 share the FD 202. In the following, descriptions of components similar to the components of the first exemplary embodiment are omitted, and different components are mainly described.

Figure 6:
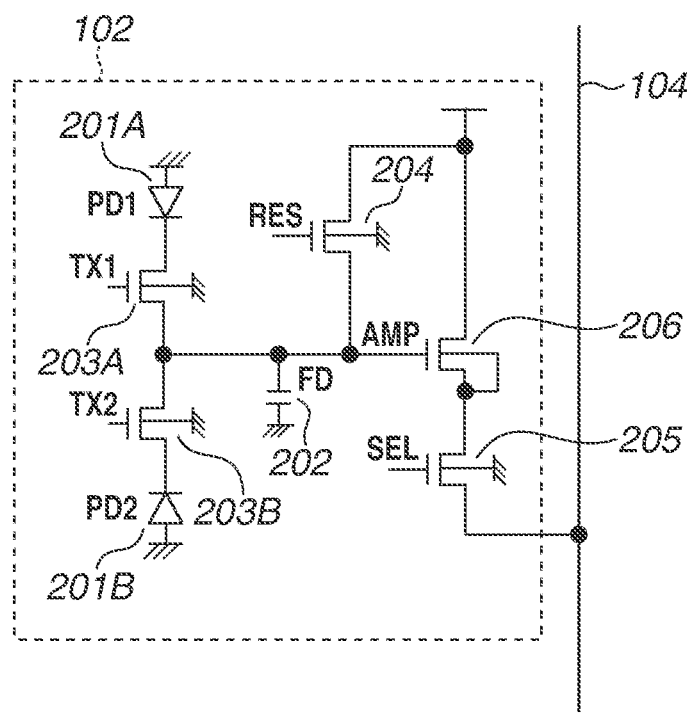
FIG. 6 is an equivalent circuit diagram of a pixel according to a second exemplary embodiment.

FIG. 6 is an equivalent circuit diagram of the pixel according to the present exemplary embodiment. Two PDs 201 and two transfer transistors TX 203 are disposed. In the following, a plurality of same components included in one pixel are denoted with alphabets A, B, . . . . For example, in a case where one pixel includes a plurality of PDs 201, a certain PD is referred to as a PD 201A, and a PD different from the certain PD is referred to as a PD 201B.

In the present exemplary embodiment, as illustrated in FIG. 6, the PD 201A and the transfer transistor TX 203A, and the PD 201B and the transfer transistor TX 203B share a readout circuit including the FD 202, the reset transistor RES 204, the selection transistor SEL 205, and the amplification transistor AMP 206.

Figure 7:
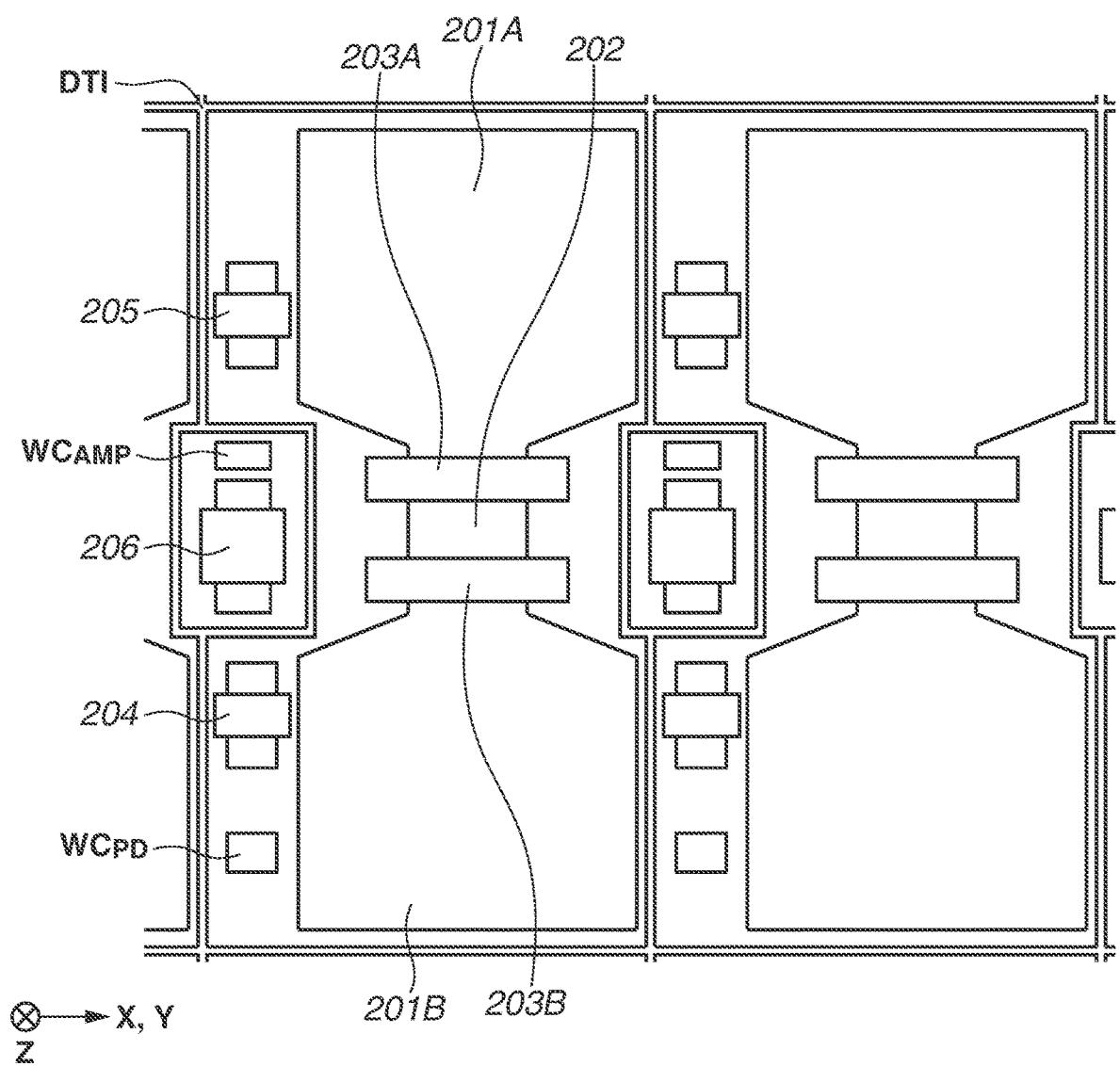
FIG. 7 is a diagram illustrating a layout of pixels according to the second exemplary embodiment.

FIG. 7 is a diagram illustrating a layout in which the pixels each illustrated in FIG. 6 are arranged in one row×two columns. As illustrated in FIG. 7, one pixel includes the PDs 201 arranged in two rows×one column. A pixel including two PDs arranged in a vertical direction on a left side of a paper surface is referred to as a pixel 1, and a pixel including two PDs arranged in the vertical direction on a right side is referred to as a pixel 2. The pixel 2 has elements similar to the elements of the pixel 1.

According to the present exemplary embodiment, as compared with the first exemplary embodiment, it is possible to reduce the number of insulating isolation portions DTI per PD, to isolate the well $W_{AMP}$ and the well $W_{PD}$ with a smaller volume, and to prevent deterioration in linearity of the signal caused by the substrate bias effect.

A pixel according to a third exemplary embodiment of the present disclosure is described with reference to FIG. 8 to FIG. 10. The present exemplary embodiment is different from the second exemplary embodiment in that a plurality of amplification transistors AMP shares the selection transistor SEL. In the following, descriptions of components similar to the components of the second exemplary embodiment are omitted, and different components are mainly described.

Figure 8:
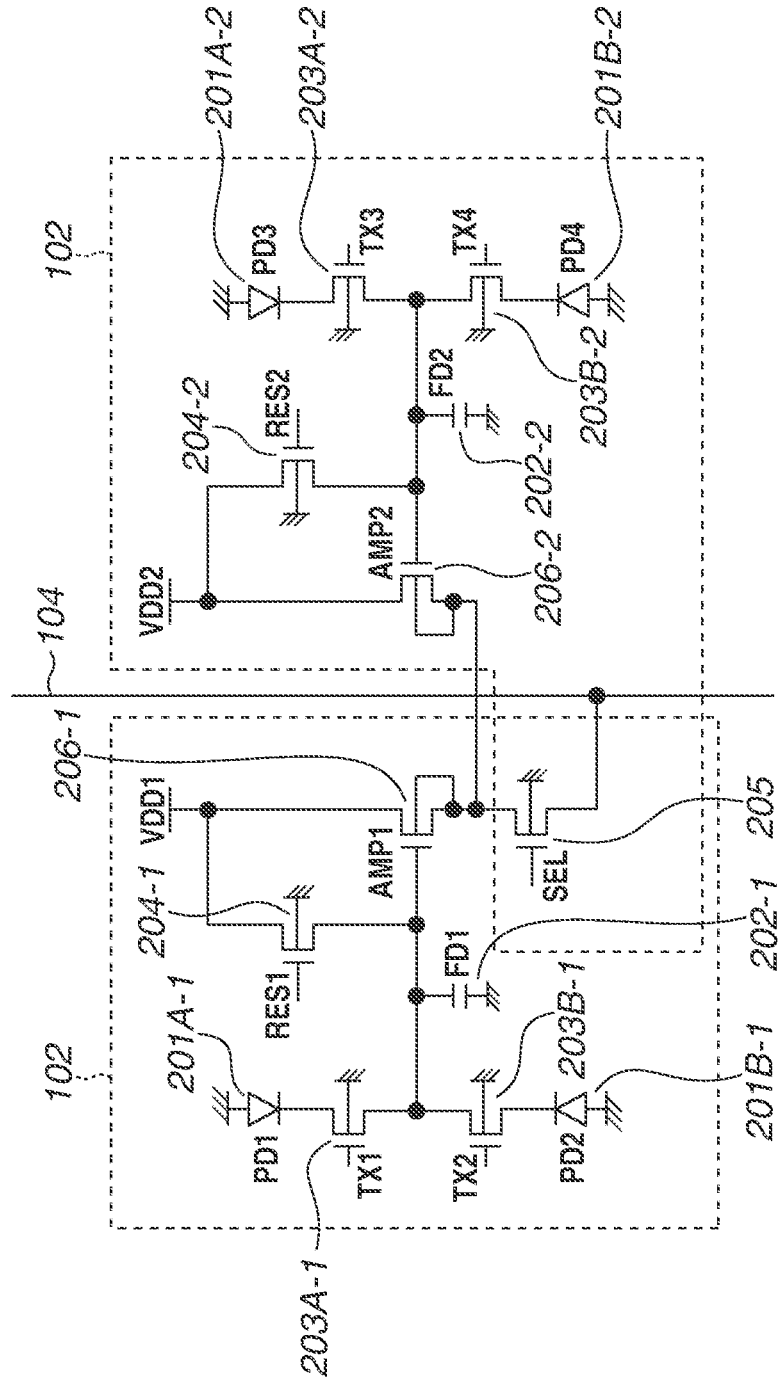
FIG. 8 is an equivalent circuit diagram of a pixel according to a third exemplary embodiment.

FIG. 8 is an equivalent circuit diagram of the pixel 102 according to the present exemplary embodiment. In FIG. 8, two pixels 102 are illustrated. In each of the pixels 102, two photoelectric conversion units PD 201 and two transfer transistors TX 203 are disposed. Further, one floating diffusion FD, one reset transistor RES, and one amplification transistor AMP are disposed. An amplification transistor AMP 206-1 of the pixel 1 and an amplification transistor AMP 206-2 of the pixel 2 share the selection transistor SEL 205. A drain voltage $V_{DD1}$ of the amplification transistor AMP 206-1 and a drain voltage $V_{DD2}$ of the amplification transistor AMP 206-2 are independently controllable.

Figure 9:
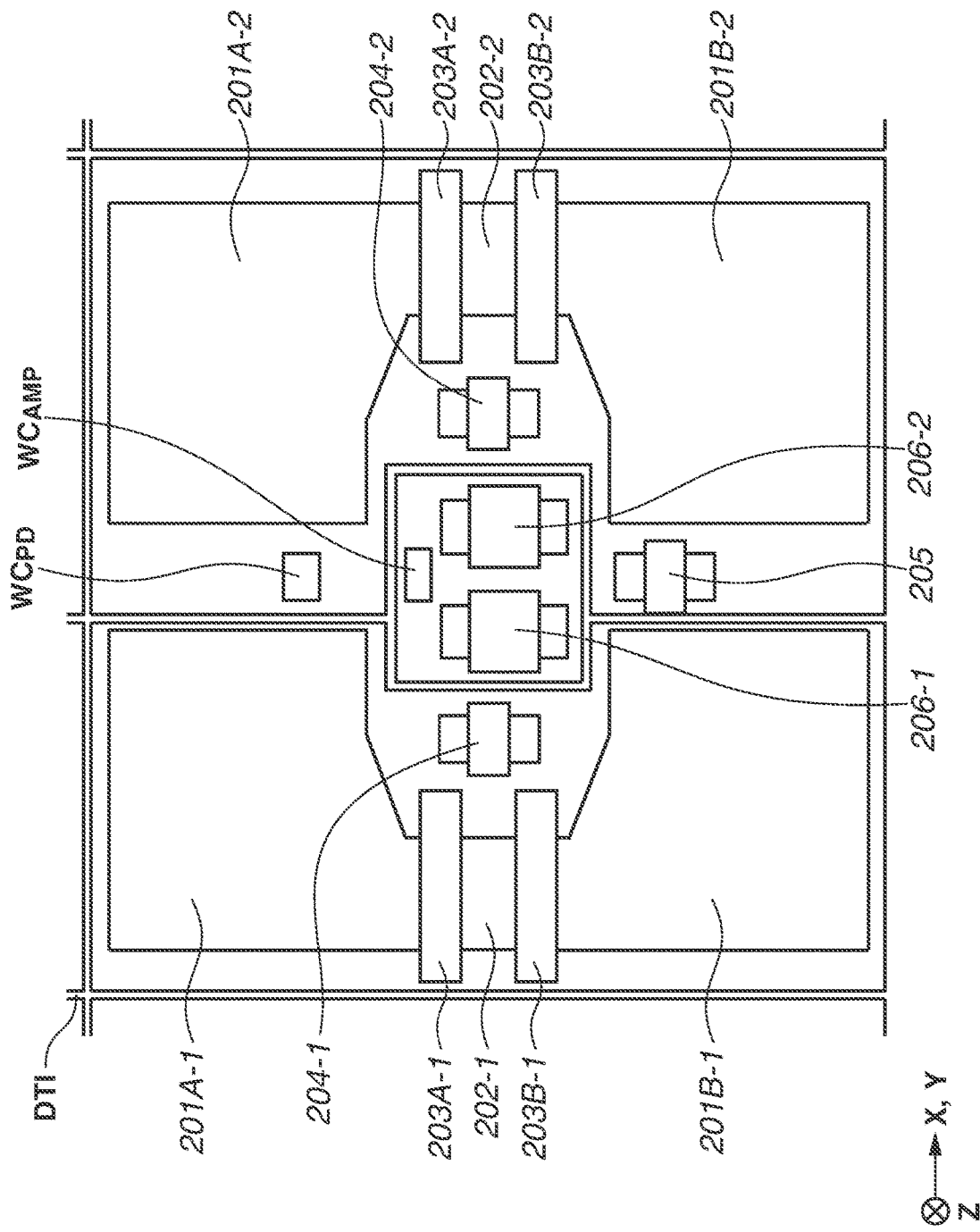
FIG. 9 is a diagram illustrating a layout of pixels according to the third exemplary embodiment.

FIG. 9 is a diagram illustrating a layout of the pixels. FIG. 9 illustrates two pixels and a range of the photoelectric conversion units PD arranged in two rows×two columns. As illustrated in FIG. 9, the amplification transistor AMP 206-1 of the pixel 1 and the amplification transistor AMP 206-2 of the pixel 2 are disposed in a region surrounded by the insulating isolation portion DTI penetrating the semiconductor substrate. In other words, a source of the amplification transistor AMP 206-1 and a source of the amplification transistor AMP 206-2 are connected to the same well $W_{AMP}$ isolated from the well $W_{PD}$.

In the present exemplary embodiment, the plurality of amplification transistors AMP is disposed in the same well $W_{AMP}$ and is driven in serial, which prevents reduction of a charge-to-voltage conversion coefficient while reducing the number of well isolation.

Figure 10:
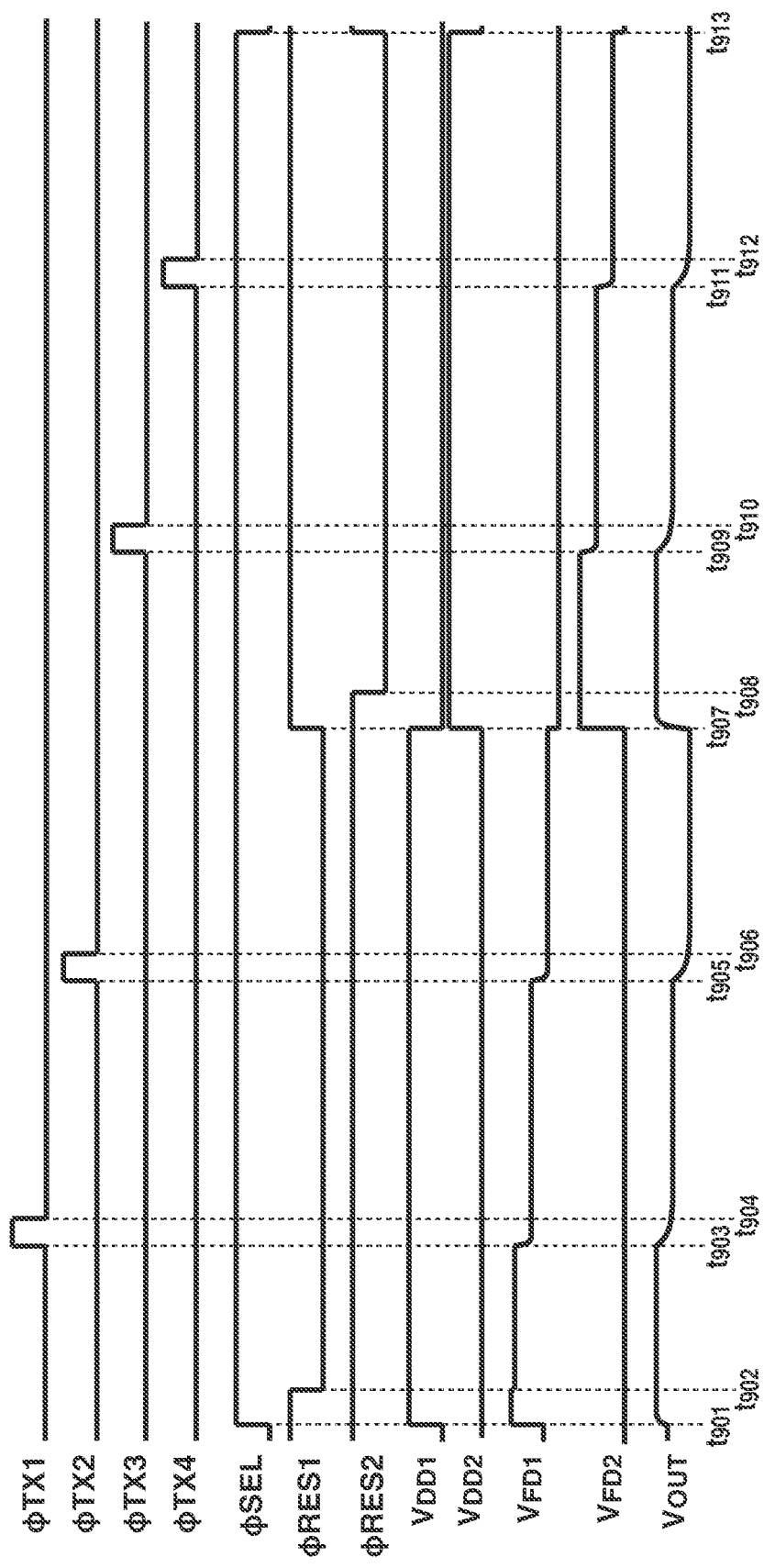
FIG. 10 is a driving timing chart of the pixel according to the third exemplary embodiment.

FIG. 10 is a driving timing chart illustrating signal readout of the pixel according to the present exemplary embodiment. In the following, an operation of the signal readout of the pixel is described with reference to the timing chart in FIG. 10.

At time $t_{901}$, the selection transistor SEL 205 is turned on, and the sources of the amplification transistor AMP 206-1 and the amplification transistor AMP 206-2 are connected to the output line 104. At this time, the drain voltage $V_{DD1}$ is a high voltage, and the drain voltage $V_{DD2}$ is a low voltage. The low drain voltage $V_{DD2}$ is applied to the gate of the amplification transistor AMP 206-2. Therefore, the current flows from the amplification transistor AMP 206-1 to the constant current source circuit 112, and the voltage $V_{OUT}$ becomes a voltage corresponding to a FD 202-1.

At time $t_{902}$, a reset transistor RES 204-1 is turned off, and the FD 202-1 is put into a floating state. During a period from time $t_{902}$ to time $t_{903}$, the AD conversion circuit 122 converts the voltage $V_{OUT}$ into a digital signal. The signal obtained at this time is referred to as an N1 signal.

At time $t_{903}$, a transfer transistor TX 203A-1 is turned off, and at time $t_{904}$, the transfer transistor TX 203A-1 is turned off. During a period from time $t_{903}$ to time $t_{904}$, charges accumulated in a PD 201A-1 are transferred to the FD 202-1. During a period from time $t_{904}$ to time $t_{905}$, the AD conversion circuit 122 converts the signal voltage $V_{OUT}$ output from the FD 202-1 to the output line 104, into a digital signal. The signal obtained at this time is referred to as an N1+S1 signal.

At time $t_{905}$, a transfer transistor TX 203B-1 is turned on, and at time $t_{906}$, the transfer transistor TX 203B-1 is turned off. During a period from time $t_{905}$ to time $t_{906}$, charges accumulated in a PD 201B-1 are transferred to the FD 202-1. During a period from time $O_M$ to time $t_{907}$, the AD conversion circuit 122 converts the signal voltage $V_{OUT}$ output from the FD 202-1 to the output line 104, into a digital signal. The signal obtained at this time is referred to as an N1+S1+S2 signal.

At time $t_{907}$, the reset transistor RES 204-1 is turned on. At this time, the drain voltage $V_{DD1}$ is a low voltage, and the drain voltage $V_{DD2}$ is a high voltage. The low drain voltage $V_{DD1}$ is applied to the gate of the amplification transistor AMP 206-1. Therefore, the current flows from the amplification transistor AMP 206-2 to the constant current source circuit 112, and the signal voltage $V_{OUT}$ becomes a voltage corresponding to a FD 202-2.

At time $t_{908}$, a reset transistor RES 204-2 is turned off, and the FD 202-2 is put into a floating state. During a period from time $t_{908}$ to time $t_{909}$, the AD conversion circuit 122 converts the signal voltage $V_{OUT}$ output from the PD 202-2 to the output line 104, into a digital signal. The signal obtained at this time is referred to as the N2 signal.

At time $t_{909}$, a transfer transistor TX 203A-2 is turned on, and at time $t_{910}$, the transfer transistor TX 203A-2 is turned off. During a period from time $t_{909}$ to time $t_{910}$, the charges accumulated in a PD 201A-2 are transferred to the FD 202-2. During a period from time $t_{910}$ to time $t_{911}$, the AD conversion circuit 122 converts the signal voltage $V_{OUT}$ output from the FD 202-2 to the output line 104, into a digital signal. The signal obtained at this time is referred to as an N2+S3 signal.

At time $t_{911}$, a transfer transistor TX 203B-2 is turned on, and at time $t_{912}$, the transfer transistor TX 203B-2 is turned off. During a period from time $t_{911}$ to time $t_{912}$, the charges accumulated in a PD 201B-2 are transferred to the FD 202-2. During a period from time $t_{912}$ to time $t_{913}$, the AD conversion circuit 122 converts the signal voltage $V_{OUT}$ output from the FD 202-2 to the output line 104, into a digital signal. The signal obtained at this time is referred to as an N2+S3+S4 signal.

An S1 signal corresponding to a charge amount of the signal charges photoelectrically converted by the PD 201A-1 is obtained from a difference between the N1 signal and the N1+S1 signal obtained in the above-described manner. In addition, an S2 signal corresponding to a charge amount of the signal charges photoelectrically converted by the PD 201B-1 is obtained from a difference between the N1+S1 signal and the N1+S1+S2 signal. An S3 signal corresponding to a charge amount of the signal charges photoelectrically converted by the PD 201A-2 is obtained from a difference between the N2 signal and the N2+S3 signal. An S4 signal corresponding to a charge amount of the signal charges photoelectrically converted by the PD 201B-2 is obtained from a difference between the N2+S3 signal and the N2+S3+S4 signal.

According to the present exemplary embodiment, as compared with the second exemplary embodiment, it is possible to reduce the number of well isolation per PD, to prevent deterioration in linearity of the signal caused by the substrate bias effect with a smaller volume, and to prevent reduction of the charge-to-voltage conversion coefficient.

A pixel according to a fourth exemplary embodiment of the present disclosure is described with reference to FIG. 11 and FIG. 12. The present exemplary embodiment is different from the first exemplary embodiment in that one pixel includes two photoelectric conversion units PD. In the following, descriptions of components similar to the components of the first exemplary embodiment are omitted, and different components are mainly described.

Figure 11:
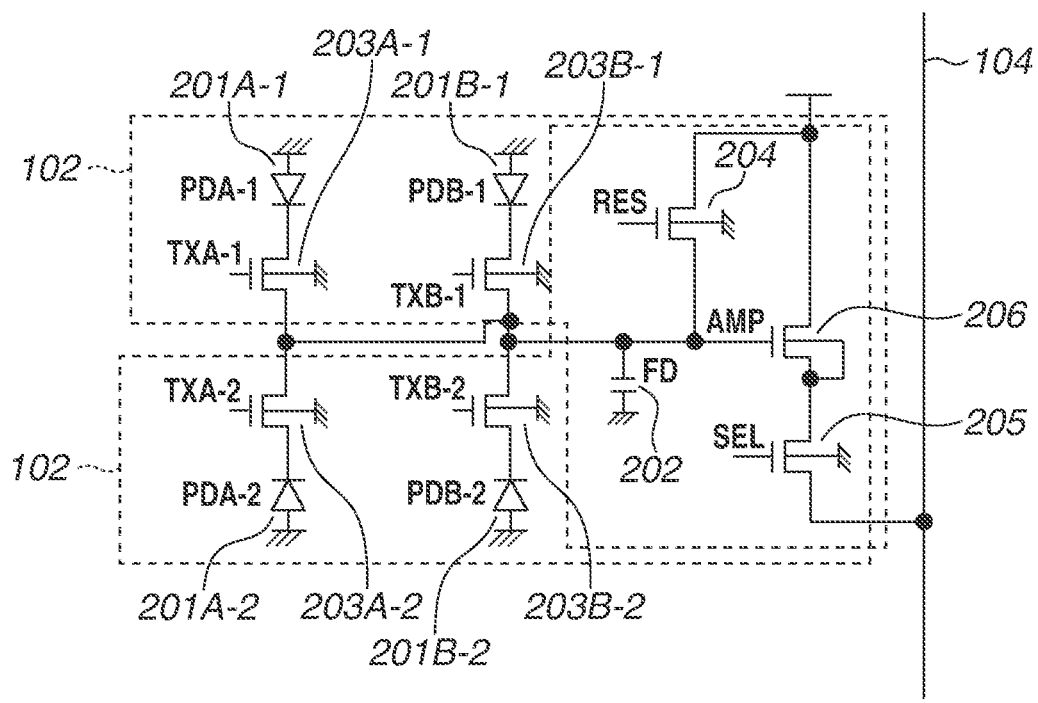
FIG. 11 is an equivalent circuit diagram of a pixel according to a fourth exemplary embodiment.

FIG. 11 is an equivalent circuit diagram of the pixel 102 according to the present exemplary embodiment. FIG. 11 illustrates an equivalent circuit diagram of two pixels 102. Each of the pixels 102 includes two photoelectric conversion units PD and two transfer transistors. Further, the two pixels share the floating diffusion FD 202, the reset transistor RES 204, the amplification transistor AMP 206, and the selection transistor SEL 205.

Figure 12:
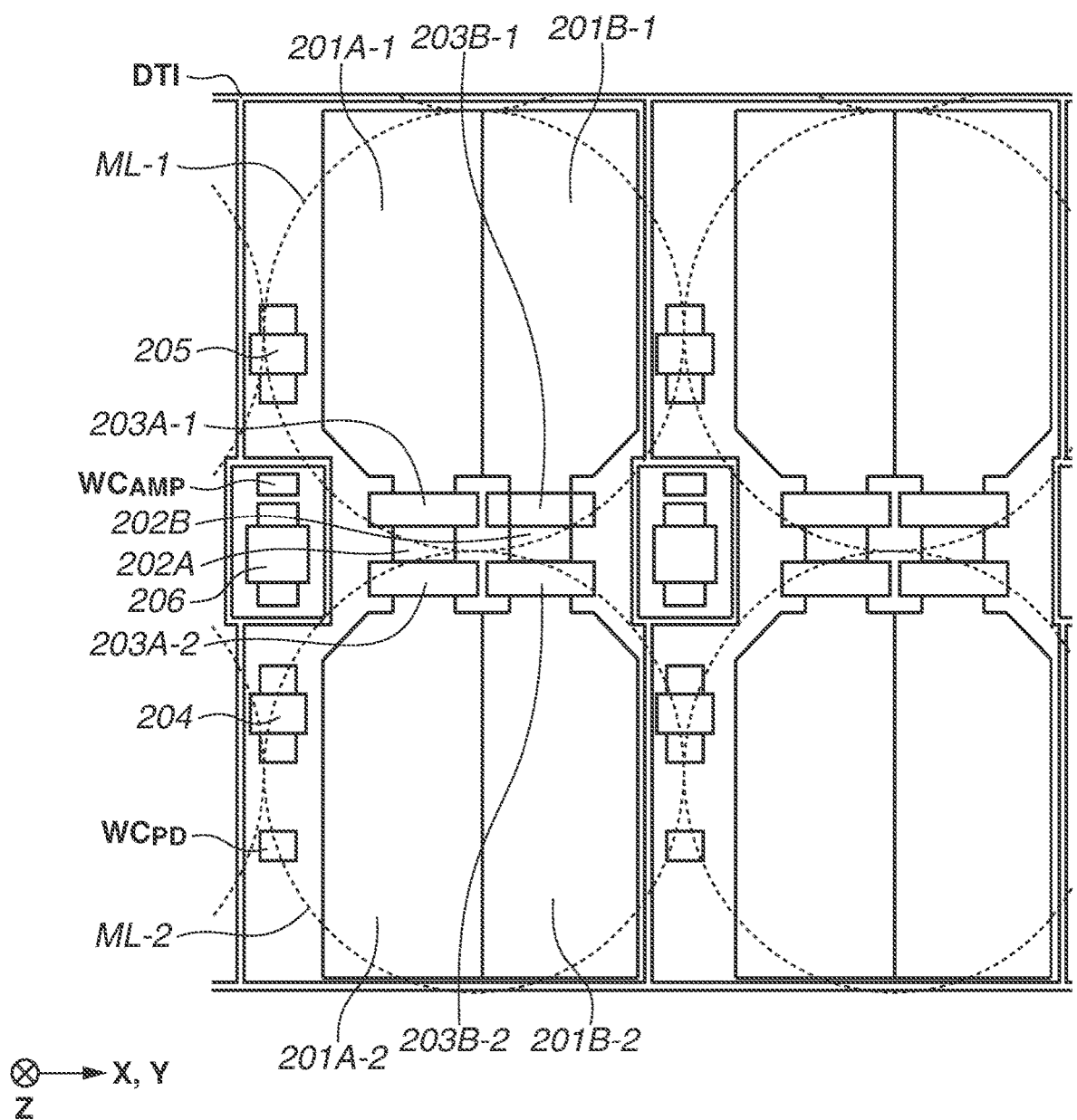
FIG. 12 is a diagram illustrating a layout of pixels according to the fourth exemplary embodiment.

FIG. 12 is a plane layout diagram of the pixels arranged in two rows×two columns. As described above, each of the pixels includes the two photoelectric conversion units PD. A pixel at an upper left on a paper surface is referred to as a pixel 1, a pixel at an upper right is referred to as a pixel 2, a pixel at a lower left is referred to as a pixel 3, and a pixel at a lower right is referred to as a pixel 4.

The photoelectric conversion units PD 201A and PD 201B in each of the pixels are isolated by the PN junction isolation without through the element isolation portion 305 composed of an insulator. A microlens ML is shared by a plurality of photoelectric conversion units PD included in each of the pixels. In other words, the microlens ML is disposed such that light passing through the microlens ML enters both of a photoelectric conversion unit PDA and a photoelectric conversion unit PDB in each of the pixels. It is possible to perform distance measurement or focus detection by a phase difference detection method based on an A image including output signals of the PDA and a B image including output signals of the PDB.

According to the present exemplary embodiment, in a phase difference detection pixel, it is possible to prevent deterioration in linearity of the signal caused by the substrate bias effect.

Figure 13:
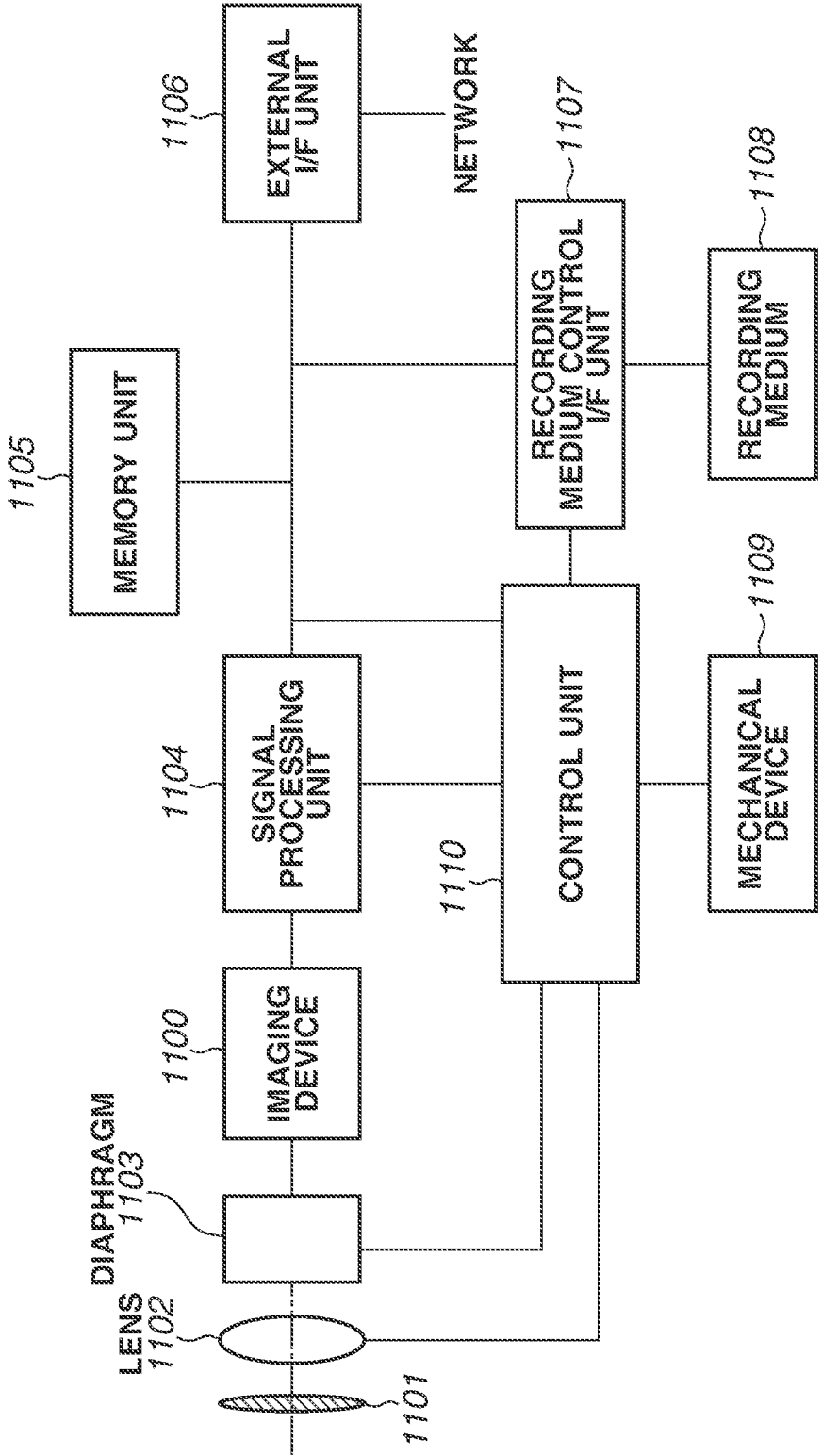
FIG. 13 illustrates an example of an imaging system according to a fifth exemplary embodiment.

FIG. 13 is a block diagram of an imaging system according to a fifth exemplary embodiment. Examples of the imaging system include a digital still camera, a digital camcorder, a camera head, a monitoring camera, a copying machine, a facsimile, a mobile phone, a smartphone, an on-vehicle camera, an observation satellite, and an artificial intelligence robot. The photoelectric conversion device according to any of the first to fourth exemplary embodiments serves as an imaging device 1100 in the present exemplary embodiment.

The imaging system illustrated in FIG. 13 includes a barrier 1101, a lens 1102, a diaphragm 1103, the imaging device 1100, and a signal processing unit 1104. The imaging system further includes a memory unit 1105, an external interface (I/F) unit 1106, a recording medium control I/F unit 1107, a recording medium 1108, a mechanical device 1109, and a control unit 1110. The barrier 1101 protects the lens 1102, and the lens 1102 forms an optical image of an object on the imaging device 1100. The diaphragm 1103 varies a quantity of light passing through the lens 1102. The imaging device 1100 is a complementary metal oxide semiconductor (CMOS) photoelectric conversion device to convert the optical image formed by the lens 1102 into image data. The imaging device 1100 can include a semiconductor substrate on which a pixel circuit, a signal processing circuit, etc. are provided, a package housing the semiconductor substrate, and a connection terminal with an external circuit. The signal processing unit 1104 performs image processing such as gradation correction and noise reduction on the image data output from the imaging device 1100.

The memory unit 1105 includes a volatile memory such as a dynamic memory or a nonvolatile memory such as a flash memory, and functions as a frame memory storing the image data. The external I/F unit 1106 is a wired or wireless interface for communication with an external computer, a network, a server, etc. The recording medium control I/F unit 1107 is an interface to record or read out the image data to or from the recording medium 1108, and the recording medium 1108 is a detachable recording medium such as a memory card including a semiconductor memory that stores the image data. The mechanical device 1109 can include a driving device to drive optical mechanisms such as the lens 1102 and the diaphragm 1103, and a mechanism device to perform attitude control of a camera head, etc. The control unit 1110 includes a central processing unit (CPU), a read-only memory (ROM), and a random access memory (RAM), and controls the whole of the imaging system based on predetermined programs. Further, the control unit 1110 can detect movement of an object in the image data, and perform predetermined processing. In FIG. 13, the signal processing unit 1104, the memory unit 1105, and the control unit 1110 are provided separately from the imaging device 1100; however, the signal processing unit 1104, the memory unit 1105, and the control unit 1110 can be provided on the semiconductor substrate same as the imaging device 1100.

Figure 14A:
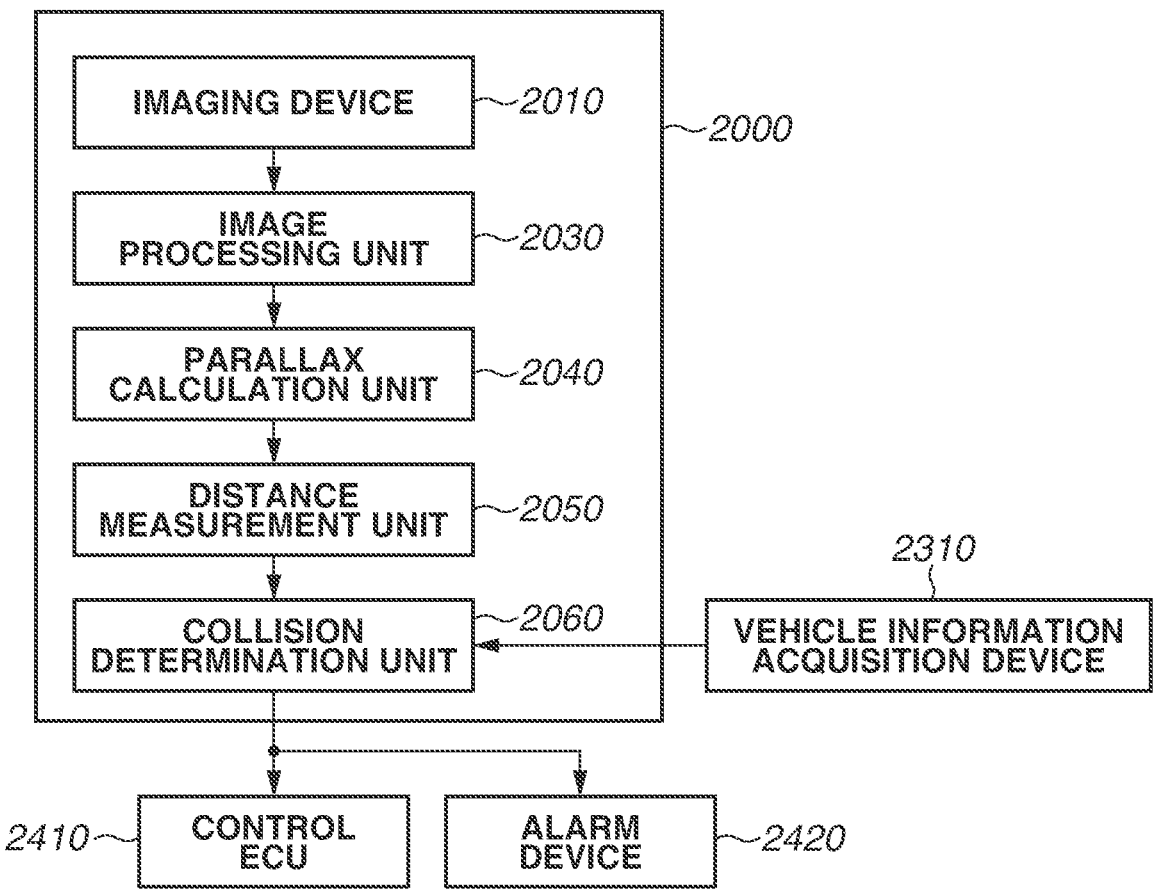
FIGS. 14A and 14B illustrate an example of an imaging system according to a sixth exemplary embodiment.
Figure 14B:
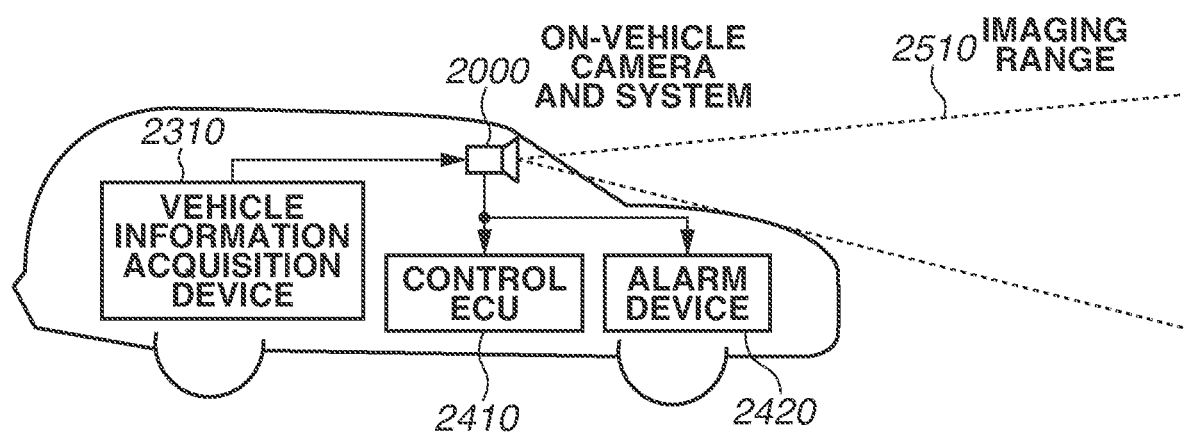

FIG. 14A and FIG. 14B illustrate an example in which the photoelectric conversion device according to any of the first to fourth exemplary embodiments is applied to the imaging system relating to an on-vehicle camera. In the present exemplary embodiment, an imaging device 2010 corresponds to the photoelectric conversion device according to any of the first to fourth exemplary embodiments.

An imaging system 2000 includes an image processing unit 2030 and a parallax calculation unit 2040. The image processing unit 2030 performs image processing on a plurality of pieces of image data acquired by the imaging device 2010. The parallax calculation unit 2040 calculates parallax (phase difference of parallax images) from the plurality of pieces of image data acquired by the imaging system 2000. The imaging system 2000 further includes a distance measurement unit 2050 and a collision determination unit 2060. The distance measurement unit 2050 calculates a distance to an object based on the calculated parallax. The collision determination unit 2060 determines whether there is collision possibility based on the calculated distance. The parallax calculation unit 2040 and the distance measurement unit 2050 are examples of a distance information acquisition unit to acquire information on a distance to an object. In other words, the distance information is information relating to parallax, a defocus amount, a distance to an object, etc. The collision determination unit 2060 can determine the collision possibility using any of these pieces of the distance information. The distance information acquisition unit can be realized by specially-designed hardware or a software module. Further, the distance information acquisition unit can be realized by a field programmable gate array (FPGA), an application specific integrated circuit (ASIC), or a combination thereof.

The imaging system 2000 is connected to a vehicle information acquisition device 2310, and can acquire vehicle information such as a vehicle speed, a yaw rate, and a steering angle. Further, the imaging system 2000 is connected to a control electronic control unit (ECU) 2410 as a control device that outputs a control signal to generate braking force to the vehicle based on a determination result of the collision determination unit 2060. Further, the imaging system 2000 is also connected to an alarm device 2420 that issues an alarm to a driver based on the determination result of the collision determination unit 2060. For example, in a case where the collision possibility is high as the determination result of the collision determination unit 2060, the control ECU 2410 controls the vehicle by applying a brake, releasing an accelerator, or suppressing engine output, to avoid collision and to reduce damage. The alarm device 2420 issues an alarm to the driver by sounding an alarm, displaying alarm information on a screen of a car navigation system, vibrating a seat belt or a steering, or the like. As described above, the imaging system 2000 functions as a control unit controlling a vehicle control operation.

In the present exemplary embodiment, the imaging system 2000 captures an image around the vehicle, for example, a front side or a back side of the vehicle. FIG. 14B illustrates the imaging system in a case where an image on the front side (imaging range 2510) of the vehicle is captured. The vehicle information acquisition device 2310 as an imaging control unit transmits an instruction to the imaging system 2000 or the imaging device 2010. Such a configuration makes it possible to improve accuracy of distance measurement.

Although the example in which the control is performed to prevent collision with another vehicle has been described above, the exemplary embodiment is applicable to automatic driving control following another vehicle, automatic driving control to prevent a vehicle from deviating from a lane, or other control. Moreover, application of the imaging system is not limited to the vehicle such as an automobile, and the imaging system is applicable to a movable body (movable apparatus) such as a vessel, an aircraft, and an industrial robot. In addition to the movable body, the imaging system is widely applicable to an apparatus using object recognition, such as an intelligent transportation system (ITS).

According to the above-described photoelectric conversion device, it is possible to prevent deterioration in linearity of a signal caused by the substrate bias effect of an amplification transistor while isolating a well provided with the amplification transistor and a photoelectric conversion unit with a small area.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-214776, filed Nov. 27, 2019, which is hereby incorporated by reference herein in its entirety.

What is claimed is:
1. A photoelectric conversion device having a plurality of pixels, each of the plurality of pixels comprising:
  a semiconductor substrate;
  a photoelectric conversion unit disposed inside the semiconductor substrate;
  a floating diffusion to which a signal carrier generated by the photoelectric conversion unit is transferred;
  an amplification transistor configured to output a signal from the photoelectric conversion unit to an output line;
  a selection transistor configured to connect the amplification transistor to the output line;

a reset transistor configured to be connected to the floating diffusion;
an insulating isolation portion, disposed between the amplification transistor and the photoelectric conversion unit and between the amplification transistor and the selection transistor to surround the amplification transistor in a plan view, configured to penetrate through the semiconductor substrate;
a first well in which the amplification transistor is disposed;
a second well in which the reset transistor and the selection transistor are disposed; and
a well contact which is disposed in the first well,
wherein a source and a drain of the amplification transistor are a first conductivity type semiconductor,
wherein the well contact is a second conductivity type semiconductor which is different from the first conductivity type semiconductor,
wherein the well contact is electrically connected to the first well, and
wherein the insulating isolation portion is disposed between the amplification transistor, and the reset transistor and the select transistor,
wherein a plurality of the amplification transistors is disposed in a region surrounded by the insulating isolation portion, and
wherein, in the plurality of amplification transistors, a voltage applied to a gate of the amplification transistor that does not perform readout is lower than a voltage applied to a gate of the amplification transistor that performs readout.

2. The photoelectric conversion device according to claim 1,
wherein the amplification transistor is a source follower transistor, and
wherein the first well is connected to the source of the amplification transistor.

3. The photoelectric conversion device according to claim 1,
wherein the photoelectric conversion unit is disposed in the second well.

4. The photoelectric conversion device according to claim 3,
wherein the floating diffusion is disposed in the second well, and
wherein the insulating isolation portion is disposed between the amplification transistor and the floating diffusion.

5. The photoelectric conversion device according to claim 1,
wherein the selection transistor is shared by the plurality of amplification transistors.

6. A photoelectric conversion device having a plurality of pixels, each of the plurality of pixels comprising:
a semiconductor substrate;
a photoelectric conversion unit disposed inside the semiconductor substrate;
a floating diffusion to which a signal carrier generated by the photoelectric conversion unit is transferred;
an amplification transistor, having a gate electrode disposed on a first surface of the semiconductor substrate, configured to output a signal from the photoelectric conversion unit to an output line;
a reset transistor configured to be connected to the floating diffusion;
a selection transistor configured to connect the amplification transistor to the output line; and
a penetrating portion, disposed between the amplification transistor and the photoelectric conversion unit and between the amplification transistor and the selection transistor to surround the amplification transistor in a plan view, configured to penetrate through the semiconductor substrate from the first surface of the semiconductor substrate to a second surface that is a light incident surface of the semiconductor substrate,
wherein the penetrating portion has a variable width in a first direction in a plan view, and
wherein the amplification transistor is located inside the penetrating portion and the photoelectric conversion unit, the reset transistor and the selection transistor are located outside the penetrating portion in the plan view.

7. The photoelectric conversion device according to claim 6, wherein the penetrating portion includes, in a cross-section intersecting with the first surface and the second surface, a first portion having a first width, a second portion having a width narrower than the first width, and a third portion having a width wider than the width of the second portion.

8. The photoelectric conversion device according to claim 7, wherein the penetrating portion includes the first portion, the second portion, and the third portion in order in a direction from the first surface toward the second surface.

9. The photoelectric conversion device according to claim 6, wherein, in the penetrating portion, a width at a same height as a height at which the first surface is located is different from a width at a same height as a height at which the second surface is located.

10. The photoelectric conversion device according to claim 8, wherein the width of at least a part of the penetrating portion is 0.5 µm.

11. The photoelectric conversion device according to claim 6, wherein a first well in which the amplification transistor is disposed is connected to a source or a drain of the amplification transistor.

12. The photoelectric conversion device according to claim 6, wherein the semiconductor substrate is a silicon substrate.

13. The photoelectric conversion device according to claim 7, wherein a shallow trench isolation (STI) structure is disposed as an element isolation portion on the first surface.

14. An imaging system, comprising:
the photoelectric conversion device according to claim 13; and
a signal processing unit configured to process a signal output from the photoelectric conversion device.

15. A movable body, comprising:
the photoelectric conversion device according to claim 13;
a distance information acquisition unit configured to acquire, from a parallax image based on a signal from the photoelectric conversion device, distance information to an object; and
a control unit configured to control the movable body based on the distance information.

* * * * *